United States Patent [19]

Upadhyaya et al.

[11] Patent Number: 4,920,497

[45] Date of Patent: Apr. 24, 1990

[54] METHOD FOR RENDERING USUABLE A DEFECTIVE RAW PROGRAMMABLE LOGIC ARRAY AND A DEFECTIVE PROGRAMMABLE LOGIC ARRAY RENDERED USABLE BY THIS METHOD

[75] Inventors: Shambhu J. Upadhyaya, Williamsville; Michael Demjanenko, North Tonawanda, both of N.Y.

[73] Assignee: State University of New York, Albany, N.Y.

[21] Appl. No.: 114,290

[22] Filed: Oct. 27, 1987

[51] Int. Cl.$^5$ .............................................. G06F 11/20
[52] U.S. Cl. .................................. 364/491; 371/11.1
[58] Field of Search ............... 364/488, 489, 490, 491; 371/11

[56] References Cited

U.S. PATENT DOCUMENTS

| | | | |
|---|---|---|---|
| 4,698,807 | 10/1987 | Marwood et al. | 371/11 |
| 4,722,084 | 1/1988 | Morton | 371/11 |
| 4,751,656 | 6/1988 | Conti et al. | 364/488 |

OTHER PUBLICATIONS

Wey et al.; "On the Design of Fault—Tolerant Programmable Logic Arrays"; International Computer Symposium, Taiwan, R.C.C., (1986).

Kuo et al.; "Efficient Spare Allocation for Reconfigurable Arrays"; IEEE Design Test of Computers, pp. 24–31, Feb. 1987.

"Method to Reconfigure Logic Signal Paths"; IBM Technical Disclosure Bulletin; vol. 29, No. 4, Sep. 1986, pp. 1575–1578.

S. Upadhyaya and M. Demjanenko, "On the Repair of Defective field Programmable Logic Arrays to Increase Yield", ICCAD (Nov. 11, 1987).

*Primary Examiner*—Bruce Y. Arnold
*Assistant Examiner*—Terry S. Callaghan
*Attorney, Agent, or Firm*—Robert P. Simpson; Michael L. Dunn

[57] ABSTRACT

A method of rendering defective raw programmable logic arrays usable by locating the manufacturing defects within the raw logic array, reconfiguring the columns of a mask logic array, and mapping the mask logic array onto the raw logic array so as to mask the defects. A defective programmable logic array rendered usable by this method.

14 Claims, 5 Drawing Sheets

---

TABLE 2

MAPPING SOLUTION (ENCIRCLED ELEMENTS IN CANDIDATE MATRIX)

| COLUMN IN MASK PLA | COLUMN IN RAW PLA |
|---|---|
| $m_1$ | $r_3$ |
| $m_2$ | $r_2$ |
| $m_3$ | $r_6$ |
| $m_4$ | $r_5$ |
| $m_5$ | $r_7$ |
| $m_6$ | $r_4$ |
| $m_7$ | $r_8$ |
| $m_8$ | $r_1$ |
| $m_9$ | $r_9$ |

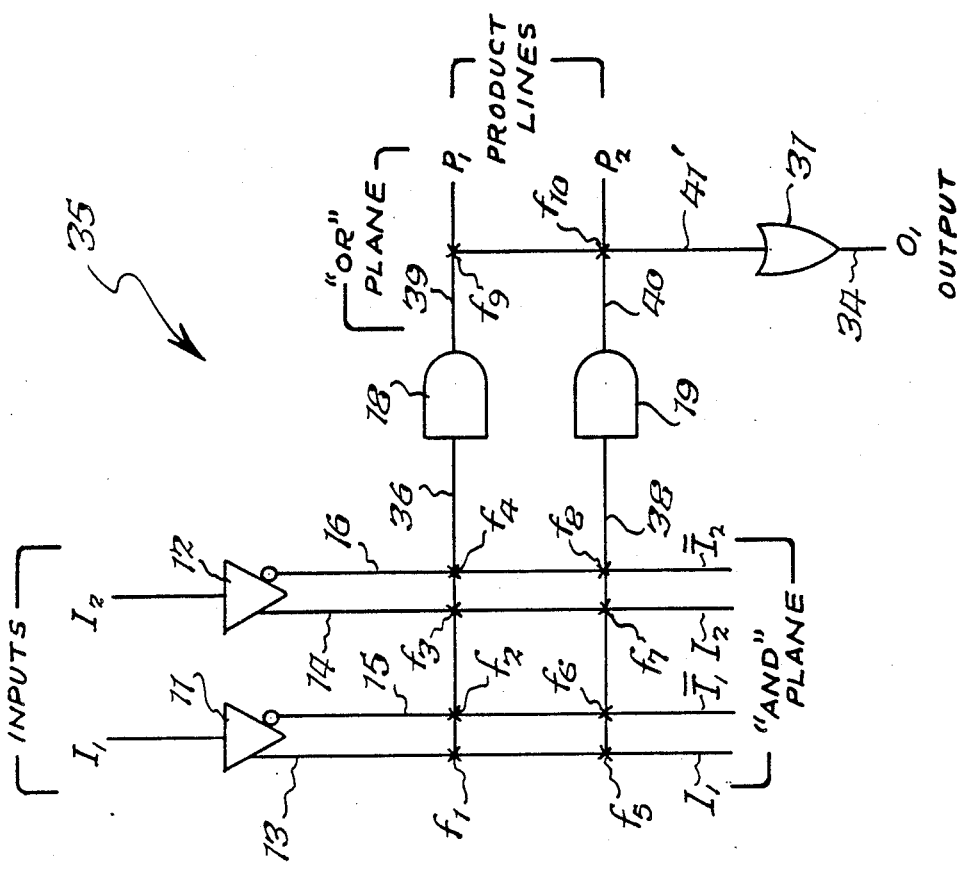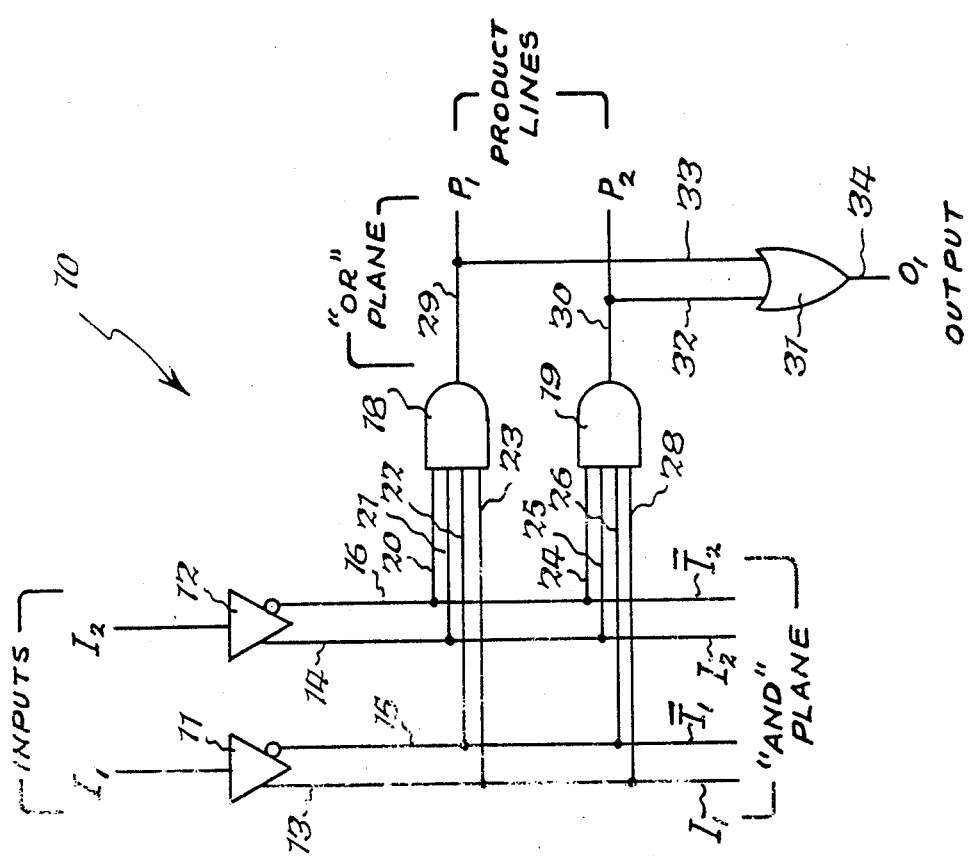

Fig. 5B. RAW PROGRAMMABLE LOGIC ARRAY

Fig. 5A. MASK PROGRAMMABLE LOGIC ARRAY

Fig. 5C. CANDIDATE MATRIX

|     | $m_1$ | $m_2$ | $m_3$ | $m_4$ | $m_5$ | $m_6$ | $m_7$ | $m_8$ | $m_9$ |
|-----|-------|-------|-------|-------|-------|-------|-------|-------|-------|
| $r_1$ | 1 | 0 | 1 | 0 | 0 | 1 | 1 | 0 | 1 |
| $r_2$ | 0 | 1 | 1 | 0 | 1 | 0 | 1 | 1 | 1 |
| $r_3$ | 1 | 1 | 1 | 0 | 0 | 0 | 1 | 1 | 1 |
| $r_4$ | 0 | 0 | 0 | 1 | 0 | 1 | 1 | 1 | 0 |
| $r_5$ | 0 | 0 | 0 | 0 | 1 | 0 | 1 | 1 | 0 |
| $r_6$ | 1 | 0 | 0 | 1 | 0 | 1 | 1 | 1 | 0 |
| $r_7$ | 1 | 1 | 0 | 1 | 1 | 1 | 1 | 1 | 1 |
| $r_8$ | 0 | 0 | 0 | 0 | 0 | 1 | 0 | 1 | 0 |
| $r_9$ | 1 | 1 | 0 | 1 | 0 | 1 | 1 | 1 | 1 |

Fig. 7.

TABLE 2
MAPPING SOLUTION
(ENCIRCLED ELEMENTS IN CANDIDATE MATRIX)

| COLUMN IN MASK PLA | COLUMN IN RAW PLA |
|---|---|
| $m_1$ | $r_3$ |
| $m_2$ | $r_2$ |
| $m_3$ | $r_6$ |
| $m_4$ | $r_5$ |
| $m_5$ | $r_7$ |
| $m_6$ | $r_4$ |
| $m_7$ | $r_8$ |
| $m_8$ | $r_1$ |
| $m_9$ | $r_9$ |

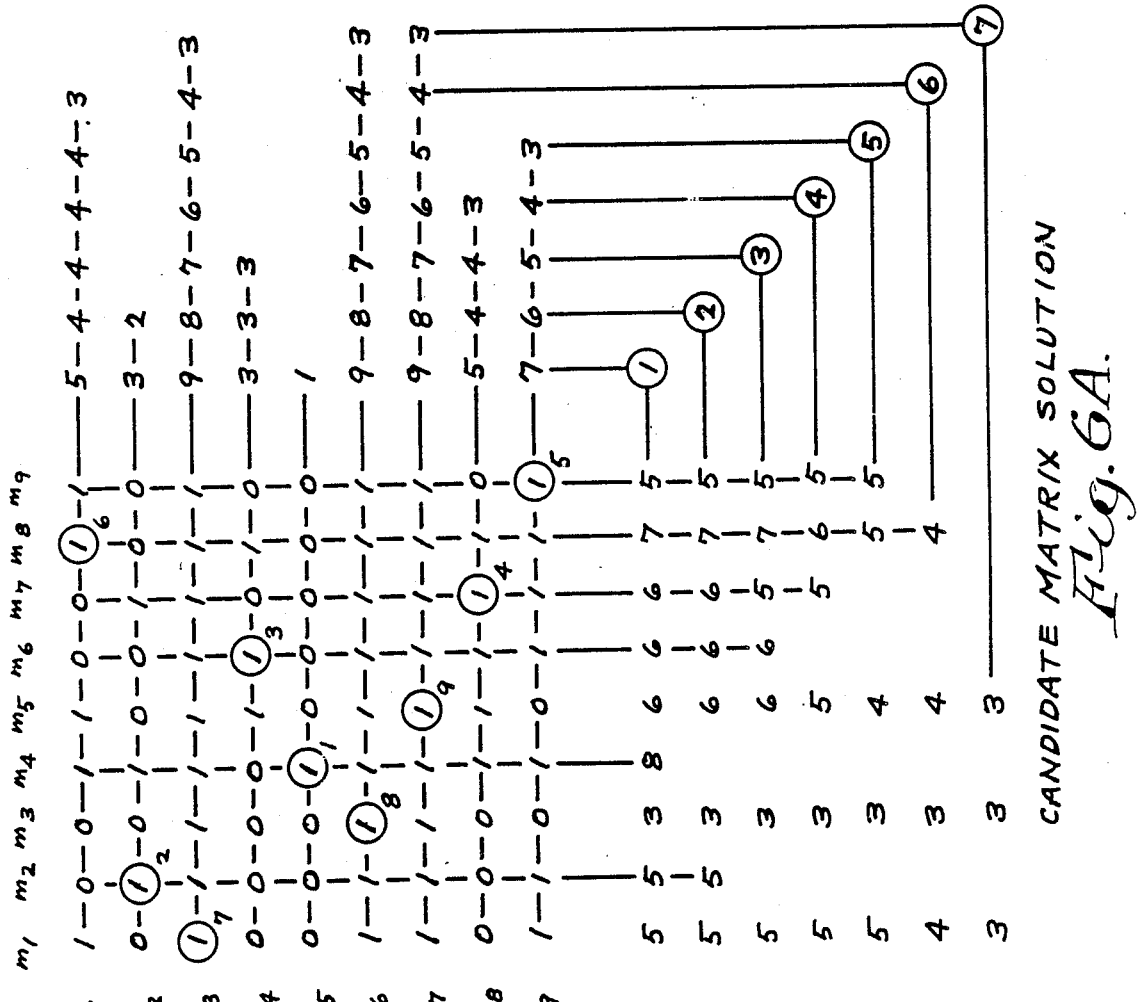
Fig. 6A. CANDIDATE MATRIX SOLUTION
Fig. 6B. TABLE I
1.) I-SET=($r_5$), I-SUM=(9)
2.) I-SET=($r_2$), I-SUM=(7,8)
3.) I-SET=($r_4,m_3$), I-SUM=(9,9,10,10,10,10)
4.) I-SET=($r_8,m_3$), I-SUM=(8,8,9,9,9)
5.) I-SET=($r_9,m_3$), I-SUM=(8,8,8,8,8,8)
6.) I-SET=($r_1,m_3$), I-SUM=(7,7,7,7,7,7)
7.) I-SET=($r_3,r_6,r_7,m_3,m_5$),
I-SUM=(6,6,6,6,6,6)

METHOD FOR RENDERING USUABLE A DEFECTIVE RAW PROGRAMMABLE LOGIC ARRAY AND A DEFECTIVE PROGRAMMABLE LOGIC ARRAY RENDERED USABLE BY THIS METHOD

BACKGROUND OF THE INVENTION

Programmable Logic Arrays (PLAs) are commonly used for implementing Boolean logic functions in Very Large Scale Integration (VLSI) chips. With advancements in VLSI technology, it is very common to pack large and complex circuits into a single chip. For example, a typical large PLA may have as many as 66 inputs, 15 outputs, and 538 product terms, requiring 87,156 internal circuit elements (transistors, diodes, etc.). However, as gate density within the chip increases and geometry shrinks, the probability of manufacturing defects also increases. It is believed that the inability to control the number of defects limits the manufacture of larger size PLAs. Thus, a real need has existed in the industry for a method of repairing manufacturing defects in PLA chips to ensure correct circuit operation and to increase chip yield, (i.e., the percentage of usable chips manufactured).

One method presently known for repairing PLAs incorporates redundant columns or rows of circuit elements. In this method, Wey, Chang, and Vai teach the use of spare inputs, outputs, product terms, and control circuits to repair single and multiple faults. [C. Wey, T. Chang, and M. Vai, "On the Design of Fault-Tolerant Programmable Logic Arrays," International Computer Symposium, Taiwan, R.C.C. (1986).] Kuo and Fuchs teach the use of an efficient algorithm for allocation of spare columns and rows in reconfigurable processor arrays and memory units. [S. Kuo and W. Fuchs, "Efficient Spare Allocation for Reconfigurable Arrays," IEEE Design & Test of Computers, pp. 24-31 (Feb. 1987).] The disadvantage of these methods is that they require that spare columns and rows be incorporated into the chip, thus limiting the size of the usable array.

The present invention uniquely solves the problem without resort to redundant circuits. The method of the invention comprises identifying the defects within the "raw" PLA (i.e., an unprogrammed PLA which may contain manufacturing defects), reconfiguring the columns of a "mask" PLA (i.e., a mask PLA is a representation of a desired programmed PLA which exhibits the "personality" or characteristics of the PLA desired to be programmed) and mapping the mask PLA onto the raw PLA so as to mask the defects. The invention employs a method of reconfiguring physical internal elements (columns of circuit elements) within the PLA, such that the user or programmer is unaware of the reconfiguration. Since the method operates on the internal elements of the array, there is no need to alter the external programming circuitry. The method requires no spare rows or columns of array elements, and no additional hardware, but may be implemented using standard PLA testing and programming hardware. Moreover, the method provides a time efficient solution to the mapping problem, obtaining a complete solution in polynomial time of the order equal to the number of product lines cubed.

SUMMARY OF THE INVENTION

The invention provides a method of rendering defective raw programmable logic arrays usable by locating the defects within the raw logic array, reconfiguring a mask logic array, and mapping the mask logic array onto the raw logic array so as to mask the defects. The invention further includes the article prepared by the method, i.e., the defective programmable logic array rendered usable by the method of the invention.

The manufacturing defects are located by applying voltages to selected inputs and outputs of the raw logic array to test continuity. A set of logic functions to be programmed is represented by a mask programmable logic array. Since a direct mapping of the mask programmable logic array onto the defective raw programmable logic array would result in error due to the defects, the columns of the mask array are reconfigured in order that a successful mapping can be achieved. A successful mapping is one which masks the defects of the raw programmable logic array. The term "mask the defect" indicates that programming is done in such a way that the defects in the raw PLA do not adversely affect the functionality of the PLA. The programming is accomplished in such a manner that the defects are "masked" or avoided.

Reconfiguration and mapping are accomplished by comparing the status of the fuse elements in the columns of the mask logic array to the status of the corresponding fuse elements in the columns of the raw logic array, with the outcome of the comparisons determining elements of a "candidate matrix". The candidate matrix therefore represents a comparison of the status of fuse elements of the mask array with the fuse elements of the raw array. Solution of the candidate matrix determines which columns of the mask logic array to map onto particular columns of the raw logic array so as to mask the defects. The term mapping generally refers to a method for programming the raw logic array. The end result of the process is to restore the raw logic array to a state of usefulness.

Accordingly, an overall object of the invention is to provide a novel method of rendering defective raw programmable logic arrays usable.

A more particular object of the invention is to provide a method of restoring defective programmable logic arrays to a usable state without the use of redundant circuits or additional external hardware.

Still another object of the invention is to provide a method of restoring defective programmable logic arrays to a usable state by reconfiguring internal elements of the array such that the user or programmer is generally unaware of the restoration process.

A further object of the invention is to provide a time efficient method of repairing programmable logic arrays which may be accomplished in polynomial time, of the order equal to the number of product lines cubed.

Still a further object of the invention is to provide a defective programmable logic array rendered usable by means of the method described herein.

These and further features, objects and advantages of the invention will become apparent to those skilled in the art from the following detailed description and appended drawings.

BRIEF DESCRIPTION OF THE DRAWINGS

FIG. 1 is a schematic diagram of a dual-AND gate, single-OR gate logic circuit.

FIG. 2 is a simplified, single-line schematic diagram of the logic circuit depicted in FIG. 1.

FIG. 5A is a matrix representation of a mask PLA, which represents a desired set of logic functions to be programmed.

FIG. 5B is a matrix representation of a raw PLA having manufacturing defects in both the AND and OR planes.

FIG. 5C is a candidate matrix which results from the comparison of the status of elements in the mask PLA with the status of corresponding elements in the raw PLA.

FIGS. 6A and 6B illustrate the process used to solve the candidate matrix to obtain the solution to the mapping problem.

FIG. 7 is a table representing the solution to the mapping problem.

DETAILED DESCRIPTION OF THE INVENTION

Figures 3, 4:
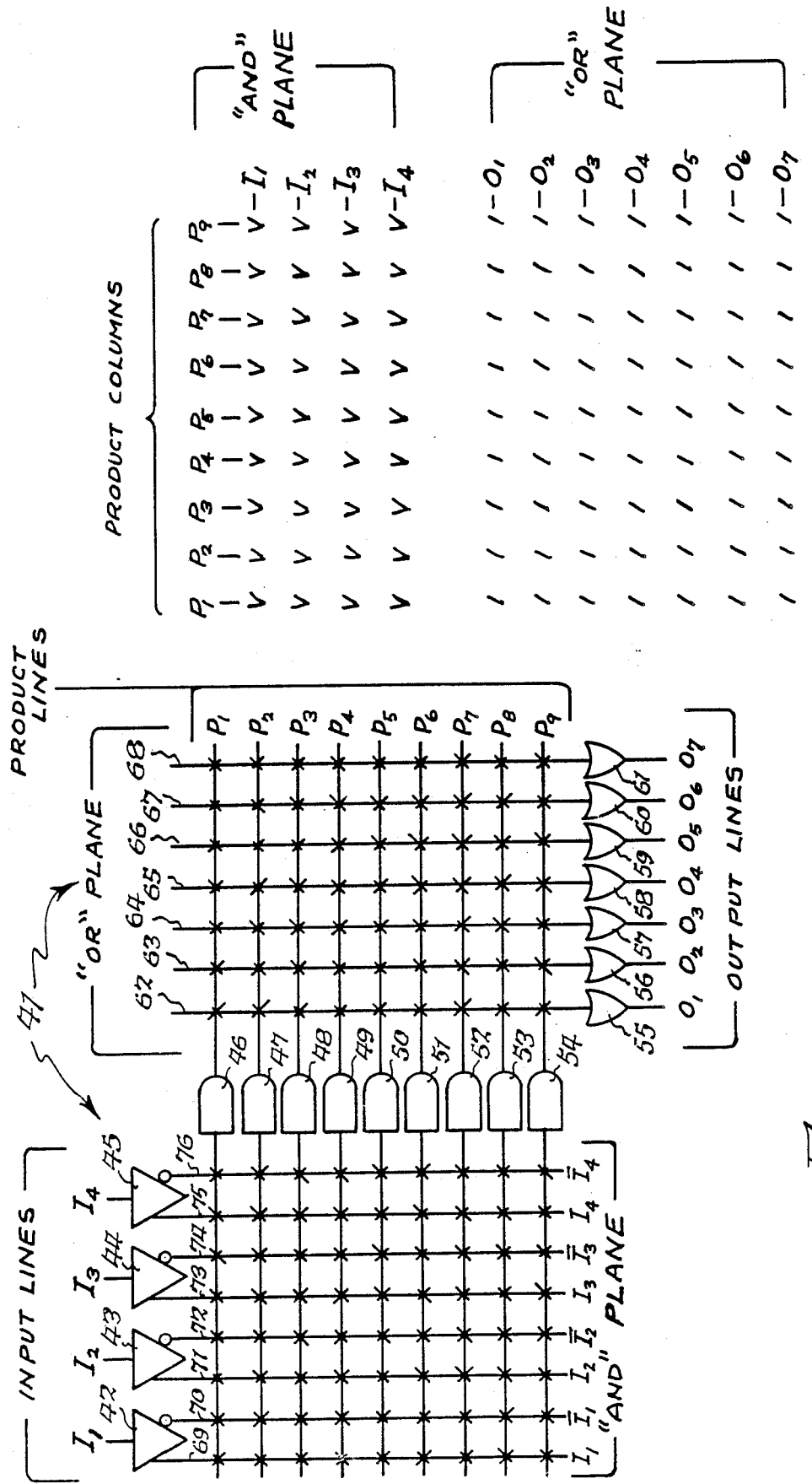
FIG. 3 is a schematic diagram of a programmable logic array having 4 inputs, 7 outputs, and 9 product lines.
FIG. 4 is a matrix representation of the logic array depicted in FIG. 3.

At the outset, it should be clearly understood that the drawings are to be read together with the specification, and are to be considered a portion of the entire "written description" of this invention, as required by 35 U.S.C. 112. Also, like reference numerals on different drawing figures refer to identical elements of the invention. It should also be noted at the outset that FIGS. 1-7 depict only a preferred embodiment of the invention and are by no means illustrative of the only way in which the invention may be practiced. For example, FIGS. 5A and 5B depict matrices as representations of the status of elements in the programmable logic array and utilize alphanumerics ("V", "X", "1", "0") to represent various circuit element conditions. It is readily apparent to one having ordinary skill in the art that these alphanumerics in the drawings, specification and claims may be replaced by other symbols which carry the same meaning, and that, in fact, other means are available to illustrate the status of circuit elements in the array. Similarly, FIG. 5C depicts a candidate matrix whose elements represent the outcome of a comparison between elements of the mask array and the raw array. It is readily apparent to one having ordinary skill in the art that this information may be easily presented in a form other than that of a matrix, and that the "1"s and "0"s of the candidate matrix may easily be replaced by other symbols. Similarly, FIGS. 6A, 6B and claim 4 illustrate one method for solving the candidate matrix to solve for the feasible mappings of the mask PLA onto the raw PLA, and it is readily apparent to one having ordinary skill in the art that other methods exist for solving the matrix which result in successful mapping.

FIG. 1.

FIG. 1 shows a schematic diagram of a dual-AND gate, single-OR gate logic circuit 10. Input signals $I_1$ and $I_2$ are communicated to inverters 11 and 12, respectively. The uncomplemented signal $I_1$ appears on inverter output line 13, and the complemented signal $\bar{I}_1$ appears on inverter output line 15. Similarly, the uncomplemented signal $I_2$ appears on inverter output line 14, and the complemented signal $\bar{I}_2$ appears on inverter output line 16. Input lines 20–23 of AND gate 18 are connected to output lines 16, 14, 15, and 13, respectively, of inverters 12 and 11. Similarly, input lines 24–28 of AND gate 19 are connected to output lines 16, 14, 15, and 13, respectively, of inverters 12 and 11.

It is well known that it is always possible to write a logical expression as a simple sum of terms, each term being a product of some combination of variables, some complemented, some not. Thus, it is always possible to express any logical function by a properly connected circuit consisting only of inverters, AND gates, and OR gates. FIG. 1 shows such a circuit for the expression of a logical function ($O_1$) in terms of input variables $I_1$ and $I_2$. Using familiar Boolean algebra notation, the logic function for the circuit of FIG. 1 may be expressed as follows:

$$(O_1(I_1,I_2) = \bar{I}_1 I_1 \bar{I}_2 I_2 + \bar{I}_1 I_1 \bar{I}_2 I_2$$

where $O_1$ is the output function in terms of input variables $I_1$ and $I_2$, and their complements $\bar{I}_1$ and $\bar{I}_2$.

FIG. 1 also shows that the array of elements between the inverter output lines 13–16 and AND gate input lines 20–26, 28 is referred to as the "AND PLANE" while the array of elements between AND gate output lines 29 and 30 and OR gate input lines 32 and 33 is referred to as the "OR PLANE". It is to be understood that the term "elements" of an array refers specifically to fusible links or solid connections which connect input lines of an AND gate with output lines of an inverter, or input lines of an OR gate with output lines of an AND gate. Also, product lines $P_1$ and $P_2$ refer to both AND gate input lines 20–26, 28 and output lines 29 and 30, which lines are situated in the AND PLANE and OR PLANE, respectively.

FIG. 2

FIG. 2 is a simplified, single-line schematic diagram of the logic circuit depicted in FIG. 1. FIG. 2 shows AND gate input lines 20–23 of FIG. 1 as represented by a single line 36 and AND gate input lines 24–26, 28 of FIG. 1 as represented by single line 38. Similarly, OR gate input lines 32 and 33 of FIG. 1 are represented by single line 41'. FIG. 2 also shows the solid connections between the output lines of inverters 11 and 12 and the input lines of AND gates 18 and 19 of FIG. 1 as replaced by fusible links $f_1$–$f_8$ in FIG. 2. Similarly, the solid connections between the output lines of AND gates 18 and 19 and the input lines of OR gate 31 have been replaced by fusible links $f_9$ and $f_{10}$. It is to be understood that fusible link $f_1$ represents a connection between lines 13 and 23 of FIG. 1, fusible link $f_2$ represents a connection between lines 15 and 22 of FIG. 1, and so on. Thus, the logical expression represented by the circuit of FIG. 1, as modified by the inclusion of fusible links $f_1$–$f_{10}$, may now be expressed as follows:

$$O_1 = [((I_1 + \bar{f}_1)(\bar{I}_1 + \bar{f}_1)(\bar{I}_1 + \bar{f}_2)(I_2 + \bar{f}_3) \\ (\bar{I}_2 + \bar{f}_4) + \bar{f}_9) + (I_1 + \bar{f}_5)(\bar{I}_1 + \bar{f}_6)(I_2 + \bar{f}_6)(I_2 + \bar{f}_7) \\ (\bar{I}_2 + \bar{f}_8) + \bar{f}_{10})]$$

where the "f" terms represent the state of the fusible links in the circuit. An unblown link represents a logic 1. Thus, f = 0 represents a blown fuse, and f = 1 represents a fuse is intact.

It is to be understood that the terms "fuse" and "fusible link" are used generically to mean any electronic device (such as a transistor, diode, etc.) whose state may be altered to represent a logic 1 or 0. Thus, it is clear that the logic circuit of FIG. 2 may be programmed to represent various logic functions simply by selectively "blowing" certain fusible links from among $f_1$–$f_{10}$. In a typical integrated circuit, these fusible links are actually transistors whose state is altered by the application of abnormally high voltages to the transistor terminals. This is commonly referred to in the art as "burning" or "programming" the logic circuit or array.

FIG. 3

FIG. 3 is a schematic diagram of a programmable logic array 41 having 4 inputs, 7 outputs, and 9 product lines. Input signals $I_1$–$I_4$ are communicated to inverters 42–45, respectively. The uncomplemented signals $I_1$–$I_4$ appear on inverter output lines 69, 71, 73, and 75, respectively. Similarly, the complemented signals $\bar{I}_1$–$\bar{I}_4$ appear on inverter output lines 70, 72, 74, and 76, respectively. OR gates 55–61 provide output signals $O_1$–$O_7$, respectively. Product lines $P_1$–$P_9$ are meant to represent symbolically both the output lines of AND gates 46–54 and the eight input lines of AND gates 46–54, respectively. In a perfect "raw" PLA (a raw PLA is one which has not yet been programmed; a perfect PLA is one which contains no manufacturing defects), product lines $P_1$–$P_9$ are connected to inverter output lines 69–76 and OR gate input lines 62–68 by fusible links, denoted in FIG. 3 by the symbol "X". The number of fusible links in a particular programmable logic array is given by the formula:

$$N = (2I + O)P$$

where,

N = number of fusible links in array
I = number of input lines in array
O = number of output lines in array
P = number of product lines in array.

Thus, for the array depicted in FIG. 3, there are $(2(4)+7)9 = 135$ fusible links. It should be noted that the symbol "X" represents an intact fuse at a particular location in the AND or OR plane. The "X" does not indicate that all eight inputs of a given AND gate are connected to a given inverter output line. The logic symbology shown in FIG. 3 has been informally adopted by integrated circuit manufacturers because it clearly establishes a one-to-one correspondence between the chip layout and the logic diagram, and affords a mechanism for easily determining the truth table and associated logic function.

It is readily apparent from FIG. 3 that a desired logic function may be expressed by logic array 41 by selectively blowing some of the fusible links while leaving others intact. This programming of the array is usually accomplished by applying abnormal voltages to selected inputs and outputs, thus blowing fuses in preselected locations within the OR and AND planes.

FIG. 3 depicts a programmable logic array (PLA) or a field programmable logic array (FPLA) in which fusible links are located in both the OR and AND planes. Thus, both planes are said to be programmable. It is to be understood, however, that the method of the invention is not limited to PLAs and FPLAs, but is applicable to the entire family of logic array circuits. For example, the method works equally well with programmable array logic (PAL) and field programmable array logic (FPAL) circuits, wherein only the AND array is programmable and the OR array is fixed. The method also works satisfactorily on programmable gate arrays (PGA) and field programmable gate arrays (FPGA), wherein the AND array is programmable and the OR array is not programmable. The method is also applicable to programmable logic sequencers (PLS) and field programmable logic sequencers (FPLS), wherein both the AND and OR arrays are programmable. In general, the method of the invention is applicable to a general family of logic array circuits and the term "programmable logic array" is meant to be a generic representation of all such circuits.

FIG. 4

FIG. 4 is a matrix representation of the logic array depicted in FIG. 3. The individual elements of the matrix represent the status of the fusible links in the raw programmable logic array. For example, a "V" in the matrix at the intersection of product line $P_1$ and input line $I_1$ indicates that fuses are intact at the intersection of product line $P_1$ and uncomplemented input line $I_1$ and at the intersection of product line $P_1$ and complemented input line $\bar{I}_1$. Similarly, a "1" in the matrix at the intersection of product line $P_1$ and output line $O_1$ indicates that a fuse is intact at the intersection of product line $P_1$ and output line $O_1$. Thus, since the matrix of FIG. 4 contains a "V" for every element of the AND plane and a "1" for every element of the OR plane, the raw logic array of FIG. 3 is said to be free of manufacturing defects since fuses are intact at all intersections.

FIGS. 5A and 5B

FIG. 5A is a matrix representation of a set of logic functions as follows:

$$O_1 = \bar{I}_2 \bar{I}_3 \bar{I}_4 + \bar{I}_1 I_2 \bar{I}_3 \bar{I}_4 + \bar{I}_1 I_2 \bar{I}_4 + I_1 \bar{I}_2 \bar{I}_3$$

$$O_2 = \bar{I}_2 \bar{I}_3 \bar{I}_4 + \bar{I}_1 I_3 \bar{I}_4$$

$$O_3 = \bar{I}_1 \bar{I}_2 I_3 + \bar{I}_2 \bar{I}_3 \bar{I}_4 + \bar{I}_1 I_2 \bar{I}_3 I_4 + \bar{I}_1 I_3 I_4 + I_1 \bar{I}_2 \bar{I}_3$$

$$O_4 = \bar{I}_1 \bar{I}_2 I_3 + \bar{I}_1 I_2 \bar{I}_3 I_4 + \bar{I}_1 I_2 \bar{I}_4 + I_1 \bar{I}_2 \bar{I}_3$$

$$O_5 = \bar{I}_1 \bar{I}_2 I_3 + \bar{I}_2 \bar{I}_3 \bar{I}_4 + \bar{I}_1 I_2 \bar{I}_3 I_4 + \bar{I}_1 I_3 \bar{I}_4$$

$$O_6 = \bar{I}_1 \bar{I}_2 I_3 + \bar{I}_2 \bar{I}_3 + \bar{I}_1 I_3 I_4 + \bar{I}_1 \bar{I}_3 \bar{I}_4$$

$$O_7 = \bar{I}_1 I_2 \bar{I}_3 I_4 + \bar{I}_2 \bar{I}_3 + \bar{I}_1 I_3 I_4 + \bar{I}_1 I_2 \bar{I}_4$$

where, $O_i$ = the output function
$I_j$ = the uncomplemented input
$\bar{I}_j$ = the complemented input.

It is desired to program the above set of logic functions into a raw PLA. Thus, FIG. 5A is a matrix representation of a "mask" PLA, which represents the personality or characteristics of the raw PLA after the desired programming has been accomplished.

Referring to FIGS. 5A and 5B, the elements "1", "0", "V", and "X" represent the status of fusible links in the mask and raw PLAs as follows:

The status of elements in the OR plane of the mask and raw logic arrays is indicated as follows:

a "1" indicates a fuse is intact at a particular output line - product line interface;

a "0" indicates a fuse is not intact at a particular output line - product line interface; and, The status of elements in the AND plane of the mask and raw logic arrays is indicated as follows:

a "V" indicates that a fuse is intact at both a particular uncomplemented input line - product line interface and at the corresponding particular complemented input line - product line interface;

a "1" indicates that a fuse is intact at a particular uncomplemented input line - product line interface and that a fuse is not intact at the corresponding particular complemented input line-product line interface;

a "0" indicates that a fuse is intact at a particular complemented input line - product line interface and that a fuse is not intact at the corresponding particular uncomplemented input line-product line interface;

an "X" indicates that a fuse is not intact at a particular uncomplemented input line - product line interface and that a fuse is not intact at the corresponding particular complemented input line-product line interface.

As stated previously, the status of the various elements of the array is determined by application of voltages at selected inputs and outputs.

Comparison of the status of elements of the mask PLA with the status of corresponding elements of the raw PLA indicate that it is not possible to directly program the raw PLA with the logic functions as represented by the mask PLA. For example, the element at the intersection of product line $M_5$ and output line $O_3$ in the mask PLA indicates an intact fuse, whereas the corresponding element in the raw PLA at product line $R_5$ and output line $O_3$ indicates the fuse is not intact due to a manufacturing defect. Since a direct mapping of the mask PLA onto the defective raw PLA would result in error due to the manufacturing defects, the columns of the mask PLA are reconfigured in order that a successful mapping can be achieved. Solution of the mapping problem results in a rearranging of the columns of the mask PLA and ultimate programming of the raw PLA using a different column configuration than would be used in programming a perfect raw PLA.

Solving the Mapping Problem

FIG. 5C

The first step in the solution of the mapping problem is the determination of a candidate matrix as shown in FIG. 5C. As depicted in FIG. 5C, the candidate matrix is an $m_i \times r_j$ matrix, where $m_i$ corresponds to the columns of the mask array, $r_j$ corresponds to the columns of the raw array, and subscripts i,j refer to the number of product lines in the mask and raw arrays, respectively. The elements of the candidate matrix are determined by comparing the status of the circuit elements in th mask PLA to the status of the circuit elements in the raw PLA. An entry at $(m_i, r_j)$ of the candidate matrix is "1" if the mapping of column $M_i$ of the mask PLA onto the column $R_j$ of the raw PLA is feasible. The entry at $(m_i, r_j)$ is "0" otherwise.

To determine a particular element $(m_i, r_j)$ in the candidate matrix, the status of each element in a particular column $M_i$ of the mask PLA is compared with the status of the corresponding element in the corresponding column $R_j$ of the raw array to determine a feasible mapping indicator. The feasible mapping indicator is a "1" if mapping of that element is feasible and "0" if mapping is not feasible. For example, if element $(M_1, I_2)$ in the mask array is a "1", indicating an intact fuse is required, but the corresponding element $(R_1, I_2)$ in the raw array is a "0", indicating the fuse is not intact (a manufacturing defect), then the feasible mapping indicator would be "0" for this comparison. The feasible mapping indicator is determined in accordance with the table listed below:

|  | Status of Element in Mask PLA | Status of Element in Raw PLA | Feasible Mapping Indicator |
|---|---|---|---|
| AND PLANE | 0 | 0 | 1 |
|  | 1 | 0 | 0 |
|  | X | 0 | 1 |
|  | 0 | 1 | 0 |
|  | 1 | 1 | 1 |
|  | X | 1 | 1 |
|  | 0 | V | 1 |
|  | 1 | V | 1 |
|  | X | V | 1 |
| OR PLANE | 0 | 0 | 1 |
|  | 1 | 0 | 0 |
|  | 0 | 1 | 1 |
|  | 1 | 1 | 1 |

When the comparisons of the status of the elements in a particular column of the mask array with the status of the corresponding elements in the corresponding column of the raw array results in feasible mapping indicators equal to "1" for all elements in the respective columns, then the candidate matrix element for that mask and raw array column is also a "1". In other words, if each element of a column of the mask array may be successfully mapped onto a given element in a particular column of the raw array, then the whole column of the mask array $(M_i)$ may be successfully mapped onto the particular column of the raw array $(R_j)$.

Once the candidate matrix is established, the matrix is solved as follows:

a. The "1"s in each row of said candidate matrix are added together to form a column-sum and the set of column-sums are arranged in an augmented column.

b. The "1"s in each column of said candidate matrix are added together to form a row-sum and the set of row-sums are arranged in an augmented row.

c. The row-sums and column-sums in the augmented rows and columns are compared to determine a minimum and the rows and columns associated with said minimum are identified as elements of an I-set.

d. A row $r_j$ and a column $m_i$ of said candidate matrix are said to I-intersect if the element of said candidate matrix at location $(m_i, r_j)$ is a "1".

e. For each row from said I-set, the I-intersecting columns are identified. For each row-column pair so identified, the respective column-sums and row-sums are added to form an I-sum.

f. For each column from said I-set, the I-intersecting rows are identified. For each row-column pair so identified, the respective column-sums and row-sums are added to form an I-sum.

g. The row-column pair associated with a minimum I-sum is identified as part of the solution to the mapping problem, such that if more than one row-column pair is associated with a minimum I-sum, one of the row-column pairs may be arbitrarily selected as part of the solution to the mapping problem.

h. The I-intersecting row and column identified in Step g above is deleted from the candidate matrix.

i. The "1"s in each remaining row of said candidate matrix are added together to form a column-sum and the set of column-sums are arranged in an updated augmented column.

j. The "1"s in each remaining column of said candidate matrix are added together to form a row-sum and the set of row-sums are arranged in an updated augmented row.

k. Steps c through j are repeated P times, where P equals the number of columns in the candidate matrix, and the number of elements of the solution.

l. If, at any time prior to determining the P elements of the solution to the mapping problem, a "0" appears as an element in an augmented row or column, then the method fails since no solution exists.

FIGS. 6A and 6B

The solution of the mapping problem for the candidate matrix of FIG. 5C is illustrated by FIGS. 6A and 6B:

1. The "1"s in each row of the candidate matrix are added together to form a column-sum and the set of column-sums are arranged in an augmented column. For row $r_1$ the column-sum is 5, for $r_2$ the column-sum is 3, for $r_3$ the column-sum is 9, and so on. Thus, the set of column-sums which comprise the augmented column for rows $r_1, r_2, r_3, \ldots, r_9$ is $\{5,3,9,3,1,9,9,5,7\}$, respectively.

2. The "1"s in each column of the candidate matrix are added together to form a row-sum and the set of row-sums are arranged in an augmented row. For column $m_1$, the row-sum is 5, for $m_2$ the row-sum is 5, for $m_3$ the row-sum is 3, and so on. Thus, the set of row-sums which comprise the augmented row for columns $m_1, m_2, m_3, \ldots, m_9$ is $\{5,5,3,8,6,6,6,7,5\}$, respectively.

3. The row-sums and column-sums are compared to determine a minimum and the rows and columns associated with said minimum are identified as elements of an I-set. The minimum of the row-sums and column-sums in the augmented row and column is 1, and this minimum is associated with row $r_5$. Thus, as shown in Table 1 of FIG. 6B, for the first iteration, row $r_5$ becomes an element of the I-set.

4. A row $r_j$ and a column $m_i$ are said to I-intersect if the element of the matrix at location $(m_i, r_j)$ is a "1".

5. The I-intersecting columns associated with row $r_5$ are identified. In this case, a "1" appears at location $(m_4, r_5)$ so $m_4$ is the only I-intersecting column associated with row $r_5$. For the row-column pair $m_4$–$r_5$, the column-sum 1 of row $r_5$ is added to row-sum 8 of column $m_4$ to form I-sum equal to 9.

6. Since this I-sum equal to 9 is the only I-sum for the first iteration, it is also the minimum I-sum. The row-column pair $r_5$–$m_4$ associated with this I-sum is identified as part of the solution to the mapping problem by encircling the element at the intersection of row $r_5$ and column $m_4$ and by subscripting the encircled element to indicate that this part of the solution was found on the first iteration. (If more than one minimum I-sum had been found {e.g., two I-sums equal to 9} then one of the associated row-column pairs would be selected arbitrarily as part of the solution).

7. The I-intersecting row and column identified in step 6 above is deleted from the candidate matrix.

8. The "1"s in each remaining row of the candidate matrix are added together to form a column-sum and the set of column-sums are arranged in an updated augmented column. For example, the first such updated column associated with rows $r_1, r_2, r_3, r_4, r_6, r_7, r_8, r_9$ contains column-sums 4, 2, 8, 3, 8, 8, 4, and 6, respectively.

9. The "1"s in each remaining column of the candidate matrix are added together to form a row-sum and the set of row-sums are arranged in an updated augmented row. For example, the first such updated row associated with columns $m_1, m_2, m_3, m_5, m_6, m_7, m_8$ and $m_9$ contains row-sums 5, 5, 3, 6, 6, 6, 7, and 5, respectively.

10. Steps 3 through 9 are repeated P times, where P equals the number of columns in the candidate matrix, and the number of elements of the solution. In the example illustrated by FIGS. 6A and 6B only seven iterations are shown since, after seven iterations, the remaining matrix contained only "1"s indicating a trivial solution exists (indicated by partial solutions 7, 8 and 9 $\{r_3$–$m_1$, $r_6$–$m_3$, and $r_7$–$m_5$, respectively$\}$).

11. Since a "0" never appears as an element in an augmented row or column, the method did not fail to find a solution.

FIG. 7

The set of encircled elements in the candidate matrix is the solution to the mapping problem, as tabulated in Table 2 of FIG. 7. As shown in Table 2, column $m_1$ of the mask array may be successfully mapped onto column $r_3$ of the raw array; column $m_2$ may be successfully mapped onto column $r_2$, and so on. It is to be understood that the method and article of this invention are "user-transparent", i.e., the mapping or programming of the raw logic array by reconfiguring the columns of the mask logic array is accomplished without reconfiguration or modification of associated external hardware or circuitry, without resort to additional external hardware or circuitry, and without resort to spare rows or columns of fusible links. Therefore, the entire restoration process is accomplished in such a manner that the user or programmer is unaware of the process. From the point of view of a user or programmer, it is generally unimportant as to whether the raw defective logic array is defective or not. If the raw logic array is defective, the method of the invention proceeds to render the defective array usable without any additional steps required of the user.

Verification of Method

The method of the invention has been tested by a simulation on a Vaxstation GPX/II computer using C programming language. Fifty-six programmable logic arrays used for logic minimization, and listed in R. Brayton, et al., "Logic Minimization Algorithms for VLSI Synthesis", Boston, Mass., Kluwer (1984), were simulated by the computer. A wide range of faults were injected into the raw PLA using random numbers. A minimum of 50 trials were conducted for each PLA. This study has shown that the success rate for the repair of defective PLAs is close to 100% for an average 6% injected fault ratio (ratio of faults injected to total number of crosspoints in raw PLA, where a crosspoint is a location where a fusible link exists or should exist).

Time Efficiency of Method

As previously discussed, the reconfiguring step of the invention, as opposed to the physical locating and mapping steps, may be assisted by solution of a mathematical matrix wherein the matrix elements represent fuse links between internal circuit elements.

In general, there exists two classes of algorithms with respect to time complexity, for solution of such a mathematical matrix:

1 Non-deterministic polynomial time algorithm (known as NP-complete algorithms)
2. Polynomial time execution algorithms Problems of Class 1 above are those whose time complexities are not polynomial, i.e., they cannot be solved in linear, quadratic, or any higher order time. Typically, they are exponential in nature. In other words, as the size of the parameters of the algorithm increases, the execution time increases exponentially. The mapping problem of this invention is of the NP-complete class of problems. It can be shown that an exhaustive checking of the candidate matrix to find a solution would require time of the order P! (P factorial) where P is the number of columns in the mask or raw PLA, and also represents the order of the candidate matrix. Due to this excessive computational time requirement, any technique or method which relies on an exhaustive search for the mapping of PLA functions is impractical for PLAs of reasonably large sizes.

Class 2 problems are time efficient, i.e., if the size of the parameters of the algorithm increases, the overall time complexity of the solution increases either linearly, quadratically or by any other order. Class 2 algorithms are practical in terms of execution time, whereas Class 1 algorithms are impractical due to excessive execution time.

The method of this invention provides a time efficient solution to an NP-complete problem. The method solves the mapping problem in polynomial time approximately equal to $P^3$ (P cubed) where P is the order of the candidate matrix and also represents the number of columns or product terms in the mask or raw PLA. This execution time has been verified by simulation on the Vaxstation GPX/II computer.

What is claimed is:

1. A method of rendering usable a defective raw Programmable Logic Array (PLA) to obtain the same results as would be obtained if the PLA was not defective and mapped with a mask logic array, said method comprising:
    locating the defects within said defective raw logic array;
    reconfiguring the columns of the mask logic array to avoid such defects; and
    mapping said reconfigured mask logic array onto said raw logic array so as to "mask said defects", wherein said reconfiguring and mapping utilizes non-defective elements of at least one column which contains a defect.

2. A method as recited in claim 1 wherein said locating of defects is accomplished by applying voltages of selected inputs and outputs of said raw logic array to test continuity.

3. A defective programmable logic array rendered usable by the method of claim 2.

4. A method as recited in claim 1 wherein said reconfiguring and mapping is accomplished by:
    comparing the status of fuse elements in the columns of said mask logic array to the status of corresponding fuse elements in columns of said raw logic array with the outcome of said comparisons determining the elements of a candidate matrix;
    solving said candidate matrix.

5. A method as recited in claim 4 wherein the candidate matrix is solved by means of a polynomial time execution algorithm.

6. A defective programmable logic array rendered usable by the method of claim 5.

7. A defective programmable logic array rendered usable by the method of claim 4.

8. A method as recited in claim 1 wherein said reconfiguring is accomplished in polynomial time, of an order approximately equal to the number of product lines of the PLA cubed.

9. A defective programmable logic array rendered usable by the method of claim 8.

10. A method as recited in claim 1 wherein execution of said method is user-transparent.

11. A defective programmable logic array rendered usable by the method of claim 10.

12. A defective programmable logic array rendered usable by the method of claim 1.

13. A method of rendering usable a defective raw Programmable Logic Array (PLA) to obtain the same results as would be obtained if the PLA was not defective and mapped with a mask logic array, said method comprising:
    locating the defects within said defective ray logic array;
    reconfiguring the columns of the mask logic array to avoid such defects;
    mapping said reconfigured mask logic array onto said raw logic array so as to "mask said defects", wherein said reconfiguring and mapping utilizes at least one non-spare column, wherein said reconfiguring and mapping is accomplished by:
    comparing the status of fuse elements in the columns of said mask logic array to the status of corresponding fuse elements in columns of said raw logic array with the outcome of said comparisons determining the elements of a candidate matrix;
    solving said candidate matrix, and wherein the status of elements in an "OR" plane of the mask and raw logic arrays may be represented as follows:
    a "1" indicates a fuse is intact at a particular output line - product line interface;
    a "0" indicates a fuse is not intact at a particular output line - product line interface; and wherein the status of elements in an "AND" plane of the mask and raw logic arrays is indicated as follows:
    a "V" indicates that a fuse is intact at both a particular uncomplemented input line - product line interface and at the corresponding particular complemented input line - product line interface;
    a "1" indicates that a fuse is intact at a particular uncomplemented input line - product line interface and that a fuse is not intact at the corresponding particular complemented input line - product line interface;
    a "0" indicates that a fuse is intact at a particular complemented input line - product line interface and that a fuse is not intact at the corresponding particular complemented input line - product line interface;
    an "X" indicates that a fuse is not intact at a particular uncomplemented input line - product line interface and that a fuse is not intact at the corresponding particular complemented input line - product line interface;
    and wherein the status of each element in a particular column of said mask array is compared with the status of the corresponding element in the corresponding column of said raw array to determine a feasible mapping indicator, where said feasible mapping indicator is a "1" if mapping is feasible and "0" if mapping is not feasible, in accordance with the table listed below:

|  | Status of Element in Mask PLA | Status of Element in Raw PLA | Feasible Mapping Indicator |
| --- | --- | --- | --- |
| AND PLANE | 0 | 0 | 1 |
|  | 1 | 0 | 0 |
|  | X | 0 | 1 |
|  | 0 | 1 | 0 |
|  | 1 | 1 | 1 |
|  | X | 1 | 1 |
|  | 0 | V | 1 |
|  | 1 | V | 1 |
|  | X | V | 1 |
| OR PLANE | 0 | 0 | 1 |
|  | 1 | 0 | 0 |
|  | 0 | 1 | 1 |
|  | 1 | 1 | 1 | and wherein candidate matrix element $(m_i, r_j)$ is a "1" if mask array column $M_i$ may be successfully mapped onto raw array column $R_j$ as indicated when said comparison results in a feasible mapping indicator equal to "1" for all elements of a particular column of said mask array and corresponding elements of the corresponding column of said ray array;

and wherein said candidate matrix is solved as follows:

(a) The "1"s in each row of said candidate matrix are added together to form a column-sum and the set of column-sums are arranged in an augmented column;

(b) The "1"s in each row of said candidate matrix are added together to form a row-sum and the set of row-sums are arranged in an augmented column;

(c) The row-sums and column-sums in the augmented row and column are compared to determine a minimum and the rows and columns associated with said minimum are identified as elements of an I-set;

(d) A row $r_j$ and a column $m_i$ of said candidate matrix are said to I-intersect if the element of said candidate matrix at location $(m_i, r_j)$ is a "1";

(e) For each row from said I-set, the I-intersecting columns are identified. For each row-column pair so identified, the respective column-sums and row-sums are added to form an I-sum;

(f) For each column from said I-set, the I-intersecting rows are identified. For each row-column pair so identified, the respective column-sums and row-sums are added to form an I-sum;

(g) The row-column pair associated with a minimum I-sum is identified as part of the solution to the mapping problem, such that if more than one row-column pair is associated with a minimum I-sum, one of said row-column pairs may be arbitrarily selected as part of the solution to the mapping problem;

(h) The I-intersecting row and column identified in Step g above is deleted from the candidate matrix;

(i) The "1"s in each remaining row of said candidate matrix are added together to form a column-sum and the set of column-sums are arranged in an updated augmented column;

(j) The "1"s in each remaining column of said candidate matrix are added together to form a row-sum and the set of row-sums are arranged in an updated augmented row;

(k) Step c through j are repeated P times, where P equals the number of columns in the candidate matrix, and the number of elements of the solution;

(l) If, at any time prior to determining the P elements of the solution to the mapping problem, a "0" appears as an element in an augmented row or column, then the method fails since no solution exists;

and wherein said solution defines the feasible mapping of said mask programmable logic array onto said programmable logic array so as to mask out the defects of said row programmable logic array.

14. A defective programmable logic array rendered usable by the method of claim 13.

* * * * *

UNITED STATES PATENT AND TRADEMARK OFFICE
CERTIFICATE OF CORRECTION

PATENT NO. : 4,920,497
DATED : April 24, 1990
INVENTOR(S) : Shambu J. Upadhyaya et al.

It is certified that error appears in the above-identified patent and that said Letters Patent is hereby corrected as shown below:

Title page:

Item (54) in the title "USUABLE" should be --USABLE--.

Claim 13, col. 12, line 16, "ray" should be --raw--.

Signed and Sealed this

Twenty-fifth Day of February, 1992

Attest:

HARRY F. MANBECK, JR.

*Attesting Officer*   Commissioner of Patents and Trademarks